(12) United States Patent
Liao

(10) Patent No.: US 8,496,161 B2
(45) Date of Patent: Jul. 30, 2013

(54) DEVICE AND METHOD FOR BRAZING A HEAT PIPE

(76) Inventor: Wen-Chih Liao, Jilong (TW)

( * ) Notice: Subject to any disclaimer, the term of this patent is extended or adjusted under 35 U.S.C. 154(b) by 0 days.

(21) Appl. No.: 13/400,487

(22) Filed: Feb. 20, 2012

(65) Prior Publication Data

US 2012/0145772 A1 Jun. 14, 2012

Related U.S. Application Data

(63) Continuation-in-part of application No. 12/705,309, filed on Feb. 12, 2010, now abandoned, which is a continuation-in-part of application No. 12/396,863, filed on Mar. 3, 2009, now abandoned, and a continuation of application No. 11/103,700, filed on Apr. 11, 2005, now abandoned.

(51) Int. Cl.
*B23K 31/02* (2006.01)

(52) U.S. Cl.
USPC .......................... 228/183; 228/219; 228/246

(58) Field of Classification Search
None
See application file for complete search history.

(56) References Cited

U.S. PATENT DOCUMENTS

| | | | |
|---|---|---|---|
| 2007/0068615 A1* | 3/2007 | Chien | 156/73.5 |
| 2007/0115637 A1* | 5/2007 | Yang et al. | 361/703 |
| 2009/0236080 A1* | 9/2009 | Lin et al. | 165/104.26 |
| 2010/0219736 A1* | 9/2010 | Dahm | 313/46 |
| 2011/0186268 A1* | 8/2011 | Yang et al. | 165/104.26 |
| 2012/0063092 A1* | 3/2012 | Lee | 361/700 |

FOREIGN PATENT DOCUMENTS

JP   07-091869 A   *   4/1995

* cited by examiner

*Primary Examiner* — Kiley Stoner
(74) *Attorney, Agent, or Firm* — Morris Manning & Martin LLP; Tim Tingkang Xia, Esq.

(57) ABSTRACT

The present invention relates to a device and method for brazing a heat pipe assembly with copper-silver alloy filler rings to improve heat dissipation efficiency of a heat pipe. The device comprises a brazing furnace and a conveyor. The brazing furnace comprises an open ended passage with a multi-stage brazing heater and cooler. The conveyor comprises an input bracket assembly, an output bracket assembly and a steel mesh belt. The method comprises steps of (A) providing multiple heat pipe components, (B) assembling the heat pipe components to form heat pipe assemblies, (C) injecting mixed gas, (D) turning on the multi-stage brazing heater and cooler, (E) placing the heat pipe assemblies on the conveyor, (F) brazing the heat pipe assemblies to form heat pipes, (G) cooling the heat pipes and (H) removing the heat pipes from the conveyor.

1 Claim, 13 Drawing Sheets

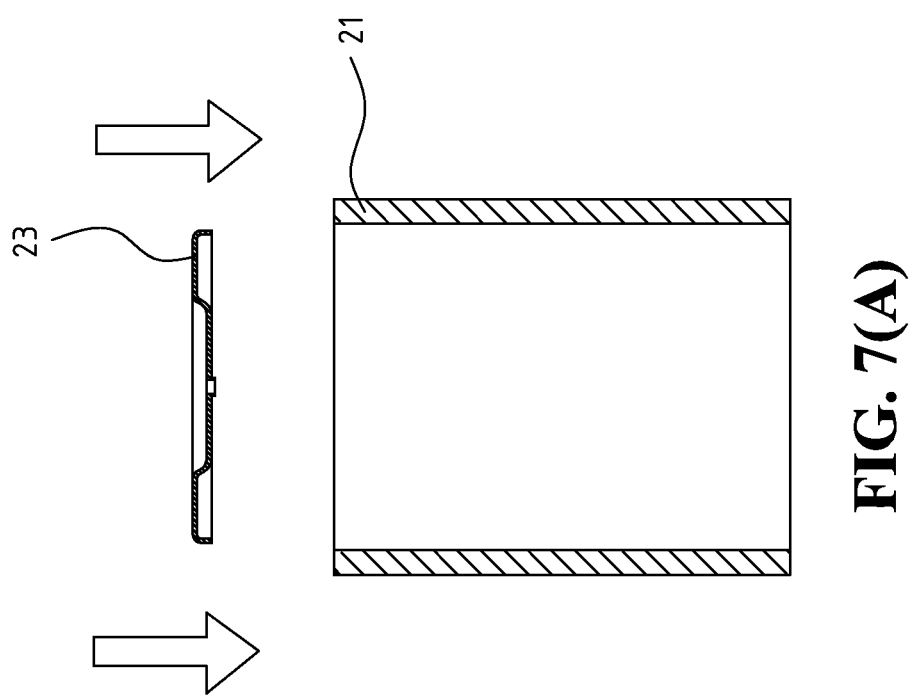

DEVICE AND METHOD FOR BRAZING A HEAT PIPE

CROSS REFERENCES TO RELATED APPLICATIONS

This application is a continuation-in-part of a co-pending U.S. patent application Ser. No. 12/705,309, filed on Feb. 12, 2010, entitled "Device and Method for Brazing a Heat Pipe", by Wen-Chih Liao, which itself claims priority to U.S. patent application Ser. No. 11/103,700, filed on Apr. 11, 2005, U.S. patent application Ser. No. 12/396,863, Filed on Mar. 3, 2009, and Taiwan Patent Application No. 093110301, filed on Apr. 13, 2004, all of the contents of which are incorporated herein by reference in their entireties.

FIELD OF THE INVENTION

The invention relates to a device and method for brazing a heat pipe with copper-silver alloy filler to improve heat dissipation efficiency of the heat pipe.

BACKGROUND OF THE INVENTION

With recent reductions in electronic equipment size, performance of electronic equipment has increased dramatically. Higher performance has resulted in more internal heat and higher operating temperature. Without effective dissipation of the internal heat, reliability and life span of the associated electronic equipment is adversely affected.

To dissipate heat from electronic equipment, conventional heat sinks and fans are used. Since heat is dissipated at a heat transfer rate proportional to a conventional heat sink's surface area, fins are attached to the heat sink to increase the surface area so more heat will be dissipated. However, small, modern electronic equipment size limits how many and how large fins can be, which provides an upper limit to how much heat can be effectively dissipated by a heat sink attached to the electronic equipment. Since heat pipes transfer heat at a much higher rate than heat sinks and fans and can be made to be much smaller than a heat sink and fan, heat pipes are excellent candidates for heat dissipation in small, high performance electronic equipment.

$$\frac{dQ}{dt} = h \cdot A(T_0 - T_{env})$$

Where
Q=Thermal energy in Joules
h=Heat transfer coefficient
A=Surface area of the heat being transferred
$T_0$=Temperature of the object's surface
$T_{env}$ Temperature of the environment Specifically, the heat transfer coefficient ($h_{wf}$) of a working fluid in a heat pipe is much higher than the heat transfer coefficient ($h_a$) of air as in a heat sink or fan.

In a conventional assembly process of a heat pipe, tin is often used as a filler to braze components of the heat pipe together and is covered with flux to reduce oxidation of the tin. However, tin has a low melting point and heat-transfer coefficient (h) and is poorly suited to dissipate heat generated by high performance electronic equipment. In addition, traditional heat pipe components soldering with tin can not pass a reduction procedure at 400° C., is oxidized, produces sand holes, brazes the heat pipe assemblies to form heat pipes needs multiple steps and let gas into the heat pipe after thermal shock or using the heat pipe for a long time. Therefore, reliability of the heat pipe is poor.

The heat pipe is hollow and air-tight, has an internal cavity, an inside surface and a wick and has a vacuum inside to maintain its heat-transfer efficiency. However, flux covering the components of heat pipe may degrade performance of the wick on the inside surface inside the heat pipe and decrease the heat-transfer efficiency of the heat pipe by raising the evaporation and condensation temperatures of the working fluid.

In a conventional heat pipe manufacturing process, the heat pipe is usually between 100 millimeter and 300 millimeter in length, is cut to fit a product specification and sealed at one end. The sealed end cannot transfer heat. The bigger the heat pipe is, the longer the sealed end is. Therefore the sealed end reduces the heat-transfer efficiency of the heat pipe.

SUMMARY OF THE INVENTION

The objective of the present invention is to braze a heat pipe with a copper-silver alloy filler to improve heat dissipation efficiency of the heat pipe.

A device for brazing a heat pipe comprises a brazing furnace and a conveyor. The brazing furnace comprises an open ended passage with a multi-stage brazing heater and cooler. The conveyor comprises an input bracket assembly, an output bracket assembly and a steel mesh belt.

A method for brazing a heat pipe in accordance with the present invention comprises steps of (A) providing multiple heat pipe components, (B) assembling the heat pipe components to form heat pipe assemblies components through only one brazing step, (C) injecting mixed gas, (D) turning on the multi-stage brazing heater and cooler, (E) placing the heat pipe assemblies on the conveyor, (F) brazing the heat pipe assemblies to form heat pipes, (G) cooling the heat pipes and (H) removing the heat pipes from the conveyor.

BRIEF DESCRIPTION OF THE DRAWINGS

FIG. 7a is a perspective view of before mounting the cover above the upper end of the pipe.

DETAILED DESCRIPTION OF THE PRESENT INVENTION

Figure 1:
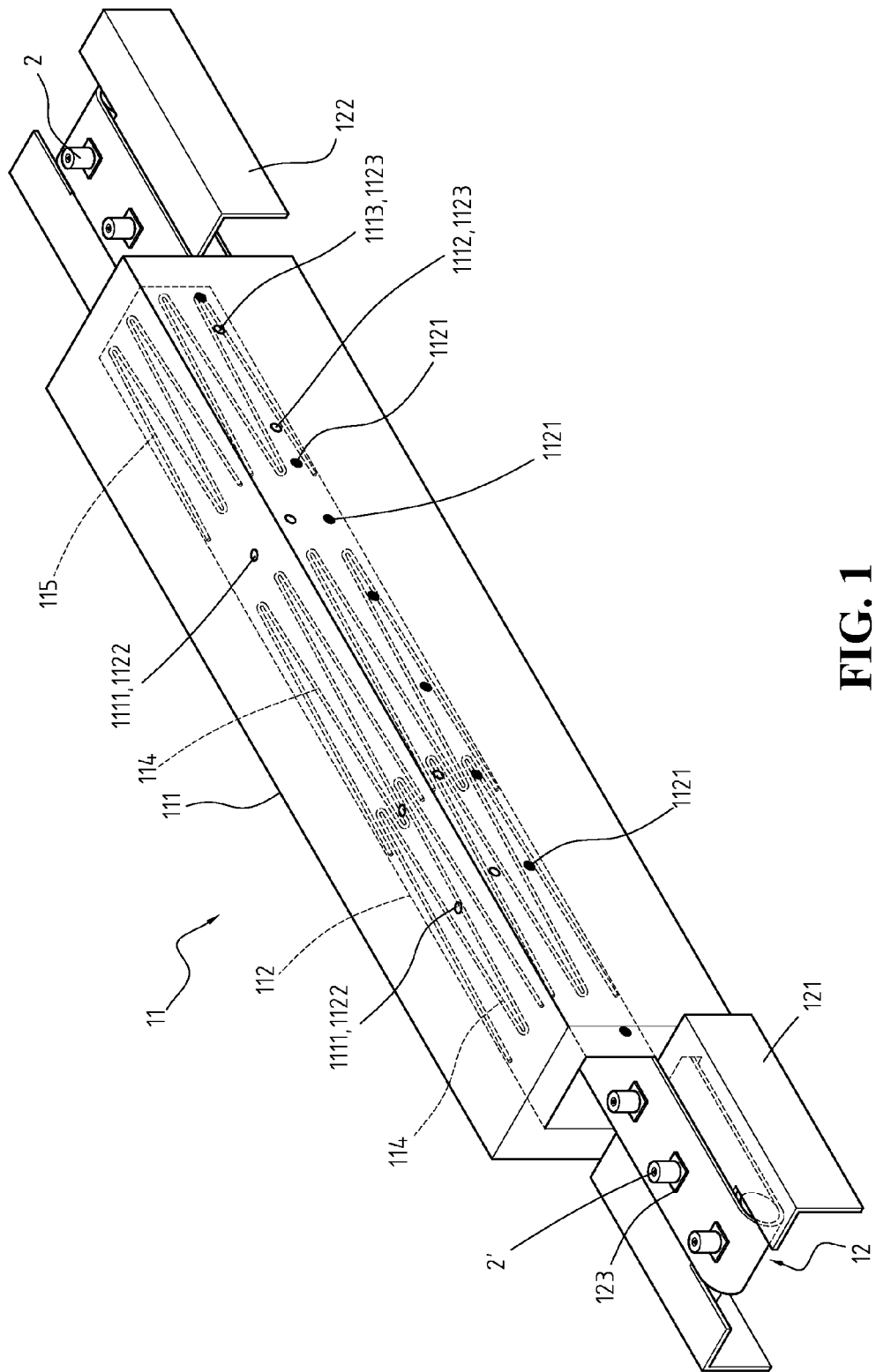
FIG. 1 is a perspective view of a device in accordance with the present invention for brazing components of a heat pipe.

With reference to FIGS. 1, 3, 4, 5, 6, 7a, 7b, 7c, 8a, 8b, 9a and 9b, a device in accordance with the present invention brazes components of a heat pipe (2) having a pipe (21), a base (22), a cover (23), a small pipe (24) and multiple copper-silver alloy filler rings (25A, 25B, 26) using a method in accordance with the present invention to braze the components. The pipe (21) is hollow and has an inner diameter, an outer diameter in range from 20 millimeters to 100 millimeters, a lower end, an upper end, an inside surface and a wick. The cover (23) is mounted in the upper end of the pipe (21), is smaller than the inner diameter of the pipe and has a central through-hole (231). The base (22) has a hole (220) that is larger than the outer diameter of the pipe (21) and is mounted on the lower end of the pipe (21). The small pipe (24) is mounted in and protrudes longitudinally from the central through-hole (231). The copper-silver alloy filler rings (25A, 25B, 26) comprise two large filler rings (25A, 25B) and a small filler ring (26). The large filler rings (25A, 25B) correspond to the pipe (21) and comprise a large upper filler ring (25B) and a large lower filler ring (25A). The large upper filler ring (25B) is put on the upper end of the pipe (21) against the cover (23). The large lower filler ring (25A) is put around the pipe (21) and against the base (22). The small filler ring (26) corresponds to the small pipe (24) and is put around the small pipe (24) and against the cover (23).

The device for brazing components of a heat pipe (2) with the copper-silver alloy fillers (25A, 25B, 26) to improve heat dissipation efficiency of the heat pipe (2) comprises a brazing furnace (11) and a conveyor (12).

The brazing furnace (11) is an elongated structure, has an input end and an output end and comprises a housing (111), a steel liner (112), multiple injection nozzles, a multi-stage brazing heater and a cooler.

The housing (111) is made of fire brick and has an input end, an output end, an internal, longitudinal passage, multiple mixed gas injection ports (1111), a cooling medium input (1112) and a cooling medium discharge (1113). The input end has an opening. The output end has an opening that corresponds to and is aligned with the opening in the input end. The internal, longitudinal passage is formed between and communicates with the openings in the input and output ends and is straight. The mixed gas injection ports (1111) are formed at intervals along the housing (111). The cooling medium input (1112) is formed through the housing (111) near the output end. The cooling medium discharge (1113) is formed through the housing (111) near the output end.

The steel liner (112) corresponds to and is mounted in the internal, longitudinal passage and comprises an inner wall, a smooth floor and multiple temperature sensors (1121). The inner wall has multiple mixed gas through-holes (1122), two cooling medium through-holes (1123), opposite sides and a ceiling. The mixed gas through-holes (1122) correspond to and align respectively with the mixed gas injection ports (1111) in the housing (111). The cooling medium through-holes (1123) correspond to and align respectively with the cooling medium input (1112) and discharge (1113). The temperature sensors (1121) are mounted longitudinally at intervals on the inner wall of the steel liner (112).

The injection nozzles are mounted detachably respectively in aligned pairs of mixed gas injection ports (1111) in the housing (111) and mixed gas through-holes (1122) in the steel liner (112) and connect to an external mixed gas source.

The multi-stage brazing heater is mounted in the steel liner (112) of the brazing furnace (11) adjacent to the input end and comprises at least two heating elements (114). Each heating element (114) is formed in a wave shape and is mounted on the sides and ceiling of the inner wall of the steel liner (112). Adjacent heating elements (114) may longitudinally overlap somewhat.

The cooler is mounted in the steel liner (112) of the brazing furnace (11) between the multi-stage brazing heater and the opening in the output end and comprises at least one cooling element (115) and at least one cooling medium input nozzle and one cooling medium discharge nozzle. The cooling element (115) is mounted on the inner wall and connects to the cooling medium through-holes (1123).

The conveyor (12) moves assembled components of heat pipes (2) through the brazing furnace (11) to melt the copper-silver alloy filler rings (25A, 25B, 26) to securely join components of a heat pipe (2) and fill any gaps between components and comprises an input bracket assembly (121), an output bracket assembly (122) and a steel mesh belt (123).

The input bracket assembly (121) is mounted adjacent to the input end of the brazing furnace (11) and comprises a flat top, two elongated legs and a drive pulley. The flat top is parallel to the floor of the steel liner (112) and has a front edge, two side edges and a rear edge. The front edge may abut the input end of the housing (111). The rear edge has a rectangular notch. The elongated legs are connected respectively to the side edges of the flat top and protrude down. The drive pulley is rotatably mounted between the elongated legs under the flat top, is aligned with the rectangular notch in the rear edge and may be driven by a motor mounted under the flat top by a shaft or gear train.

The output bracket assembly (122) is mounted adjacent to the output end of the brazing furnace (11) and comprises a flat top, two elongated legs and an idler. The flat top is parallel to the floor of the steel liner (112) and has a rear edge, two side edges and a front edge. The rear edge may abut the output end of the housing (111). The front edge has a rectangular notch. The elongated legs are connected respectively to the side edges of the flat top and protrude down. The idler is rotatably mounted between the elongated legs under the flat top and is aligned with the rectangular notch in the front edge.

The steel mesh belt (123) is mounted around the drive pulley of the input bracket assembly (121) and the idler of the output bracket assembly (122) in a loop and comprises an upper outbound leg and a lower return leg.

The upper outbound leg after passing around the drive pulley slides along the flat top of the input bracket assembly (121) on which heat pipe assemblies (2') that have not been brazed are placed on the steel mesh belt (123), the floor of the steel liner (112) of the brazing furnace (11) and the flat top of the output bracket assembly (122) and extends around the idler. The lower return leg extends from the idler, passes under the output bracket assembly (122), the brazing furnace (11) and the input bracket assembly (121) and engages the drive pulley.

Figure 2:
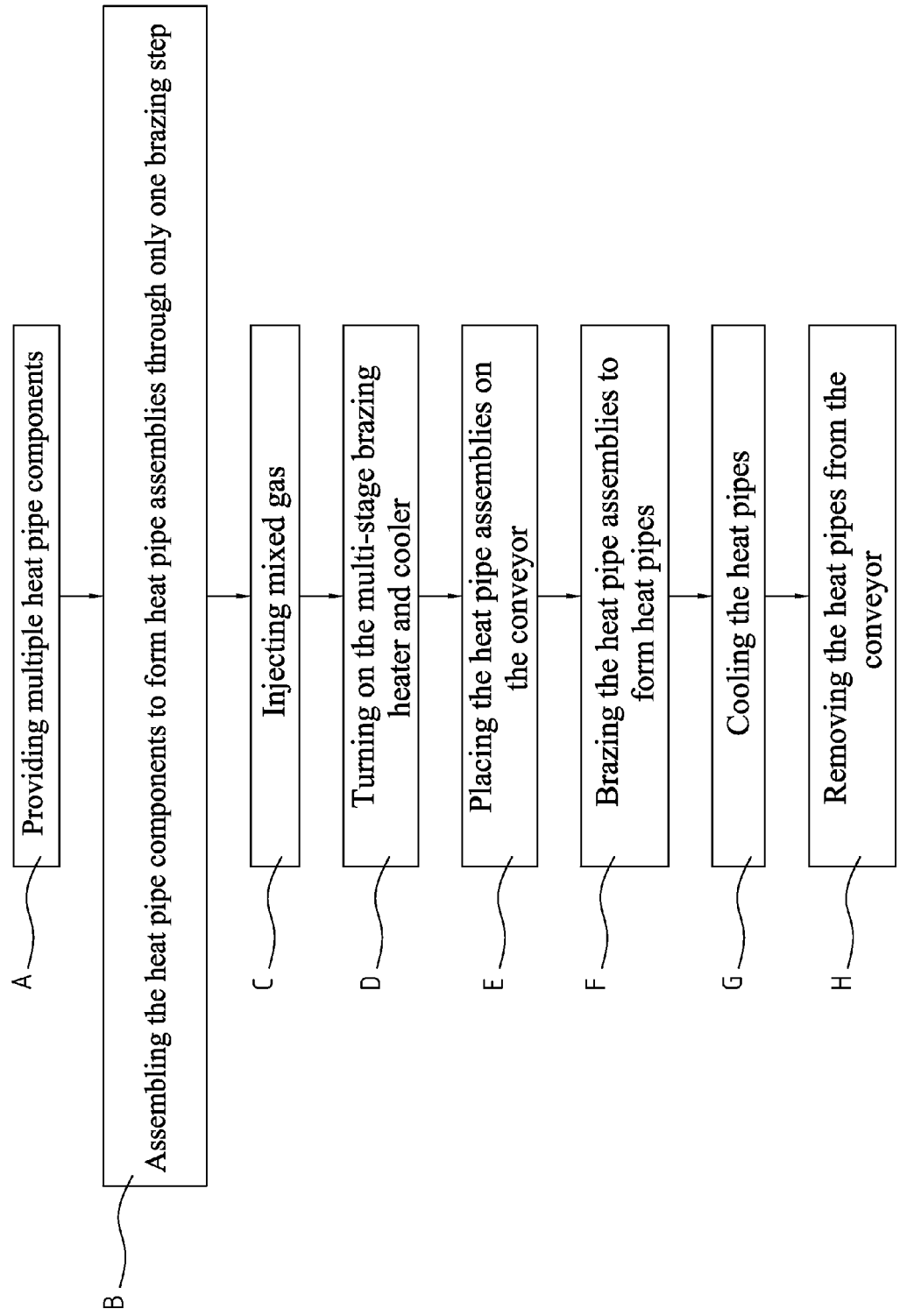
FIG. 2 is a flow chart of a method in accordance with the present invention for brazing components of a heat pipe.
Figure 3:
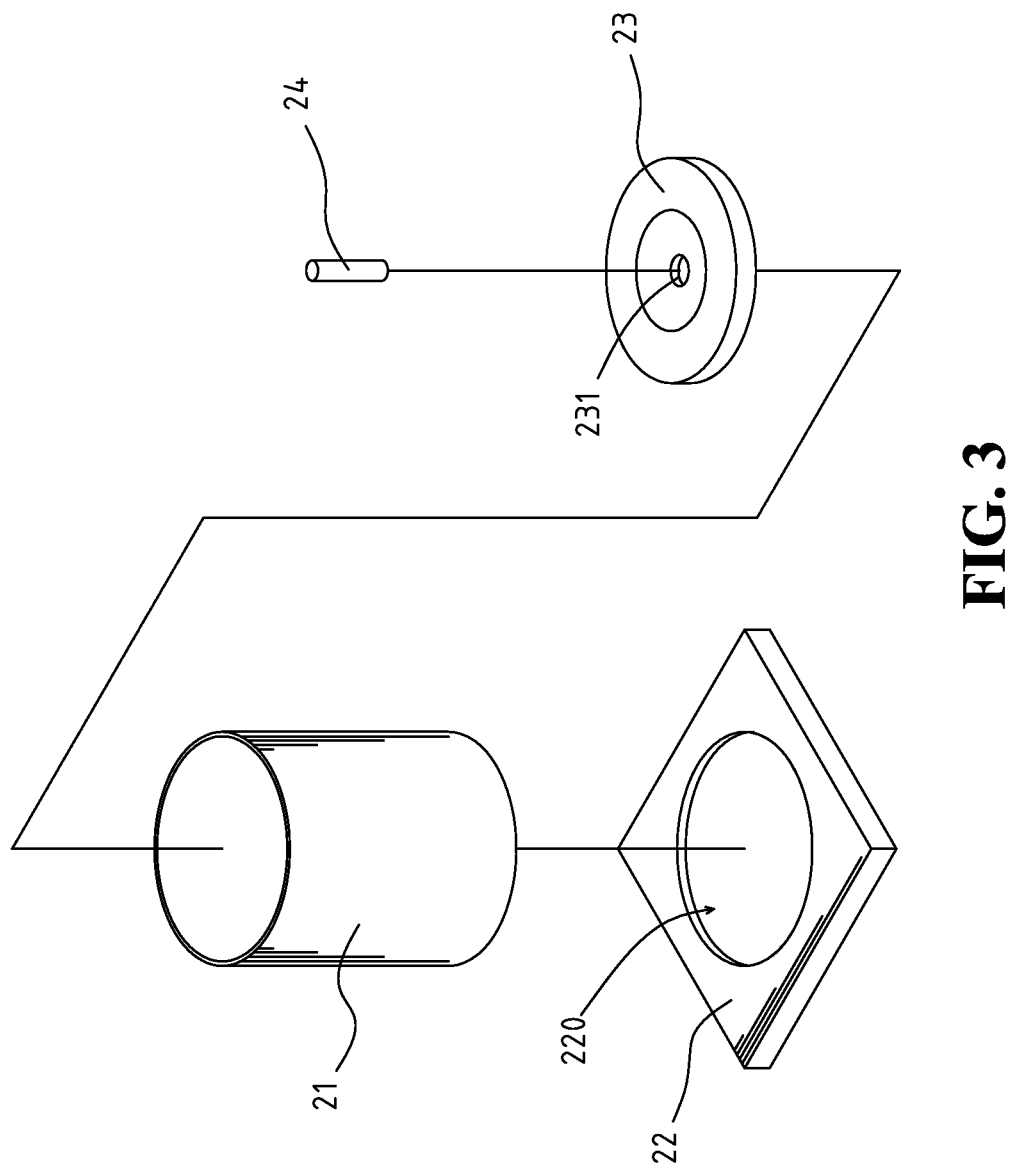
FIG. 3 is an exploded perspective view of primary components of a heat pipe to be brazed with the method in FIG. 2.
Figure 4:
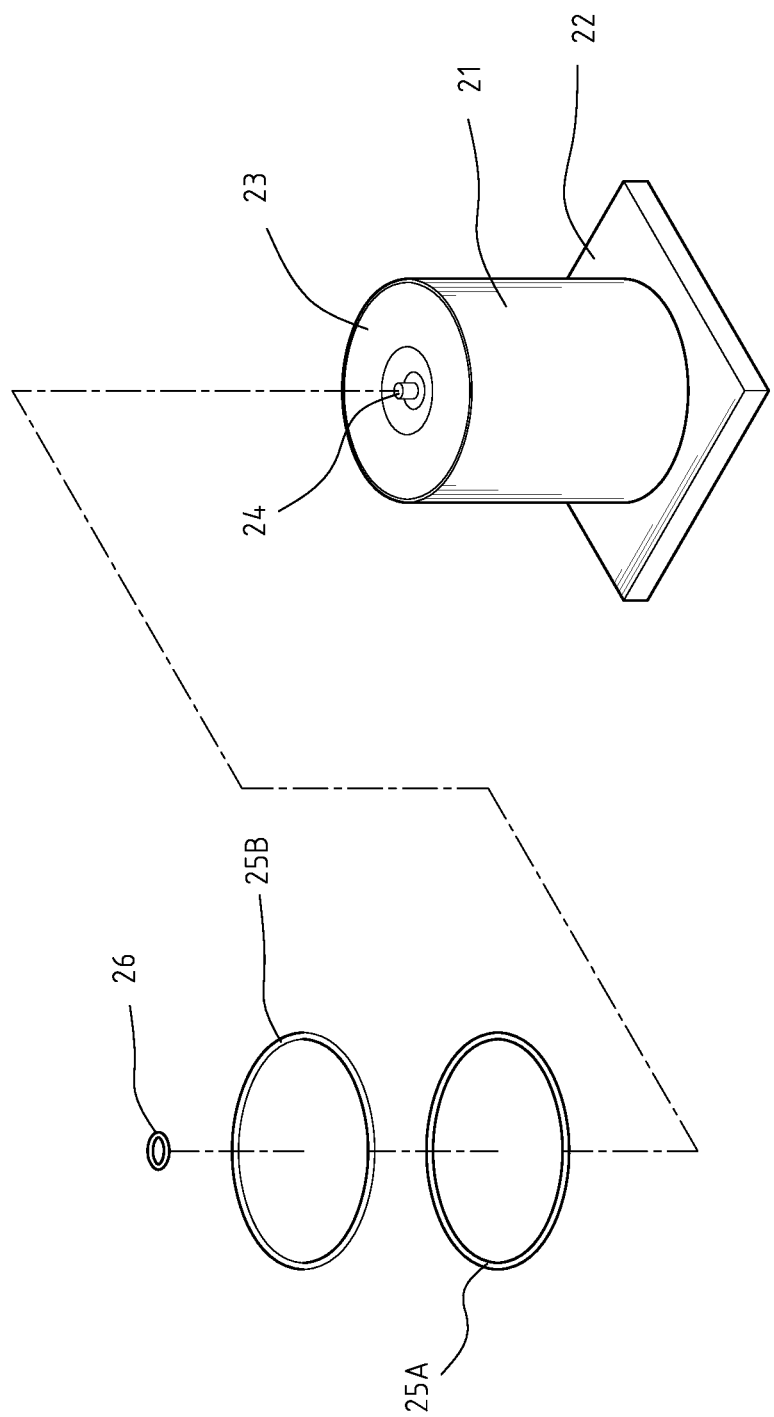
FIG. 4 is a partially exploded perspective view of components of a heat pipe to be brazed with the method in FIG. 2.
Figure 5:
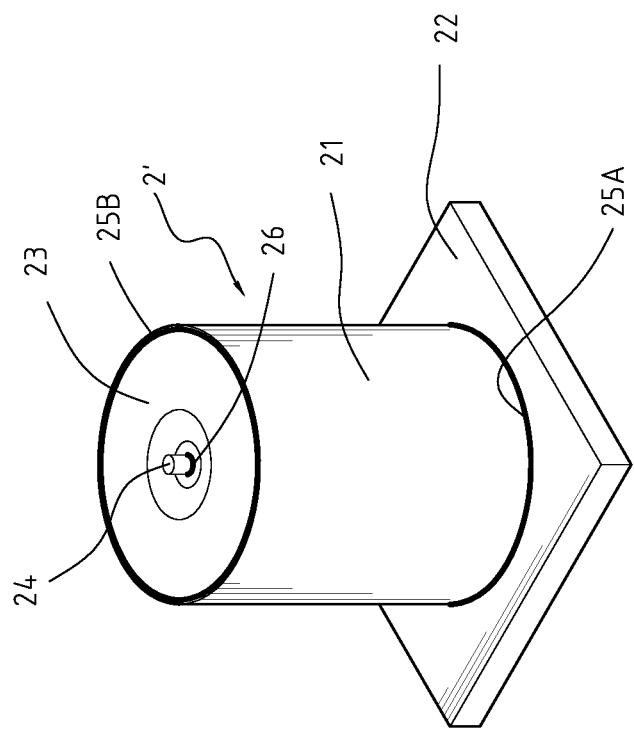
FIG. 5 is a perspective view of assembled components of a heat pipe to be brazed with the method in FIG. 2.
Figure 6:
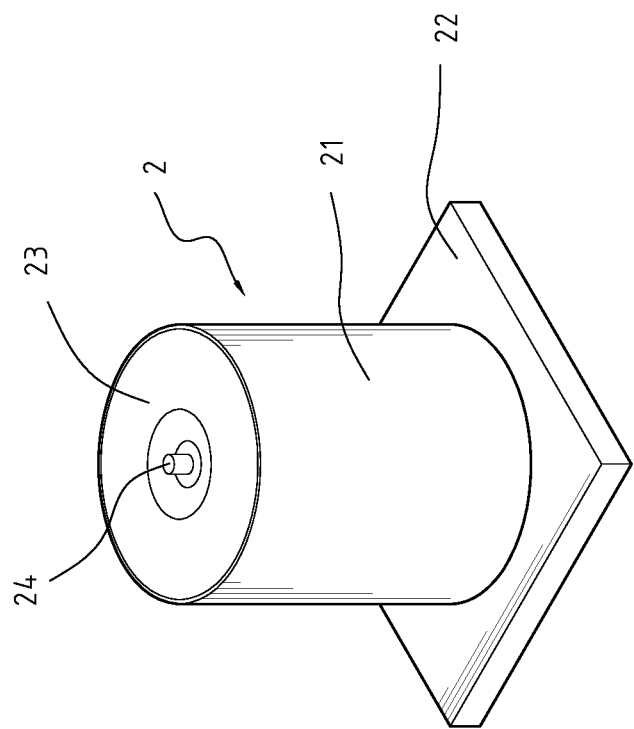
FIG. 6 is a perspective view of components of a heat pipe brazed with the method in FIG. 2.
Figure 7B:
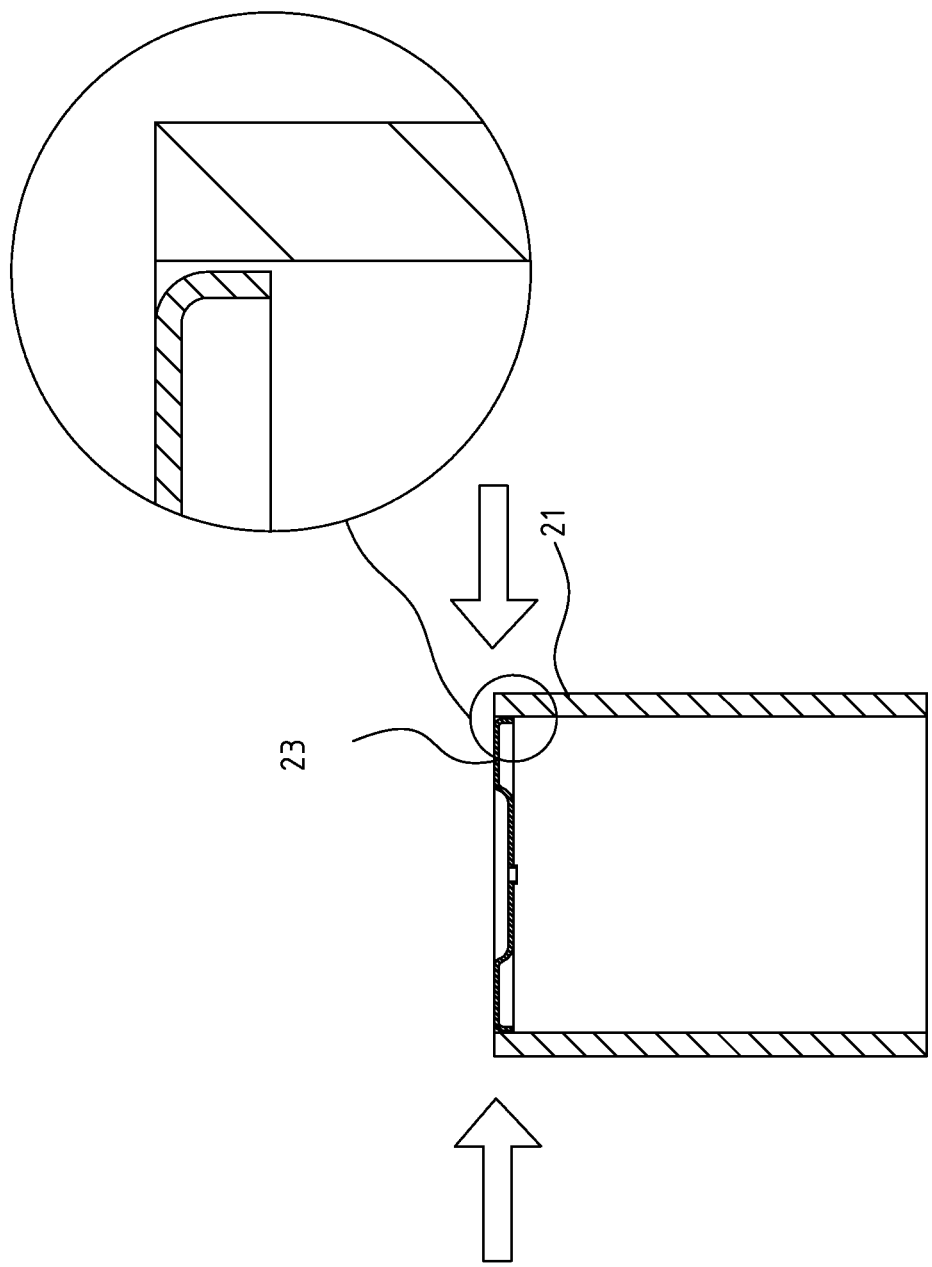
FIG. 7b is a perspective view of before mounting the cover in the upper end of the pipe.
Figure 7C:
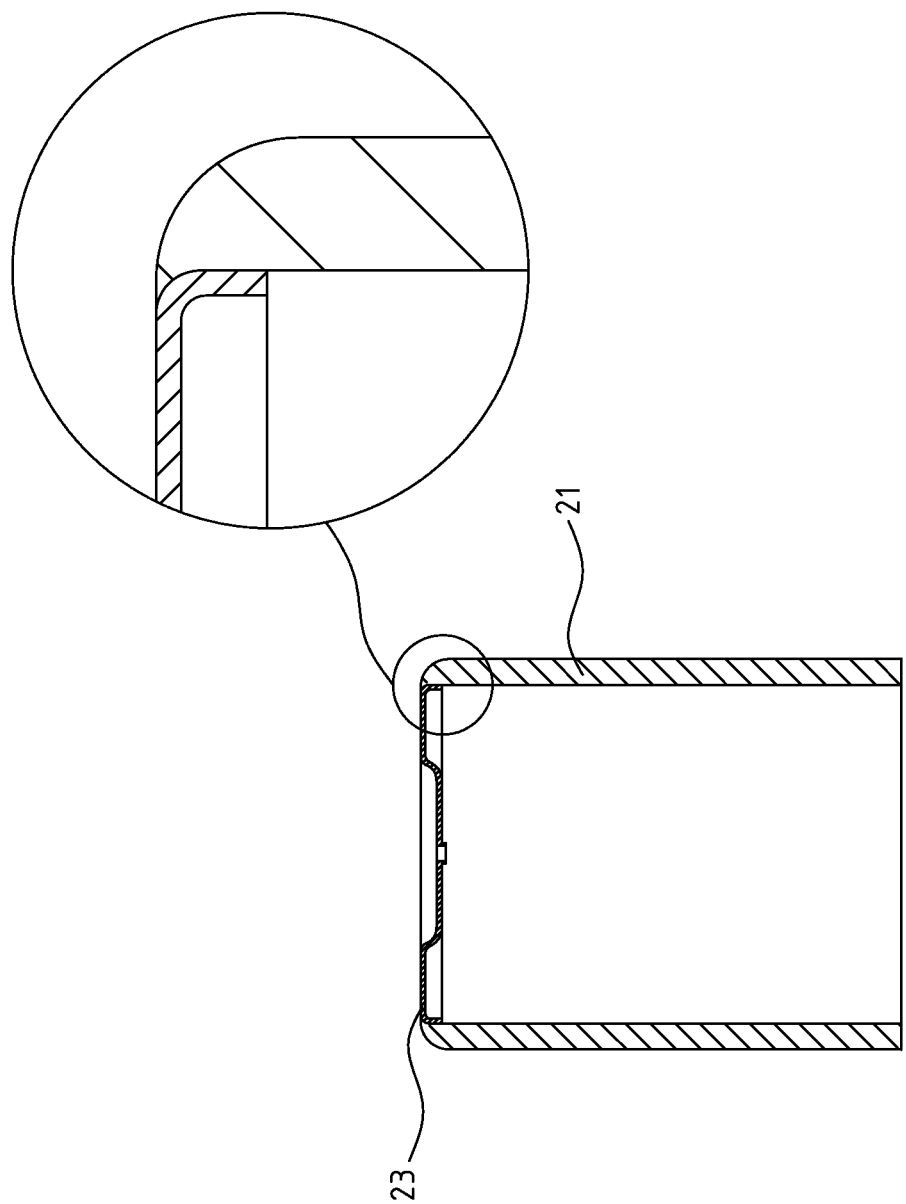
FIG. 7c is a perspective view of after mounting the cover in the upper end of the pipe.
Figure 8A:
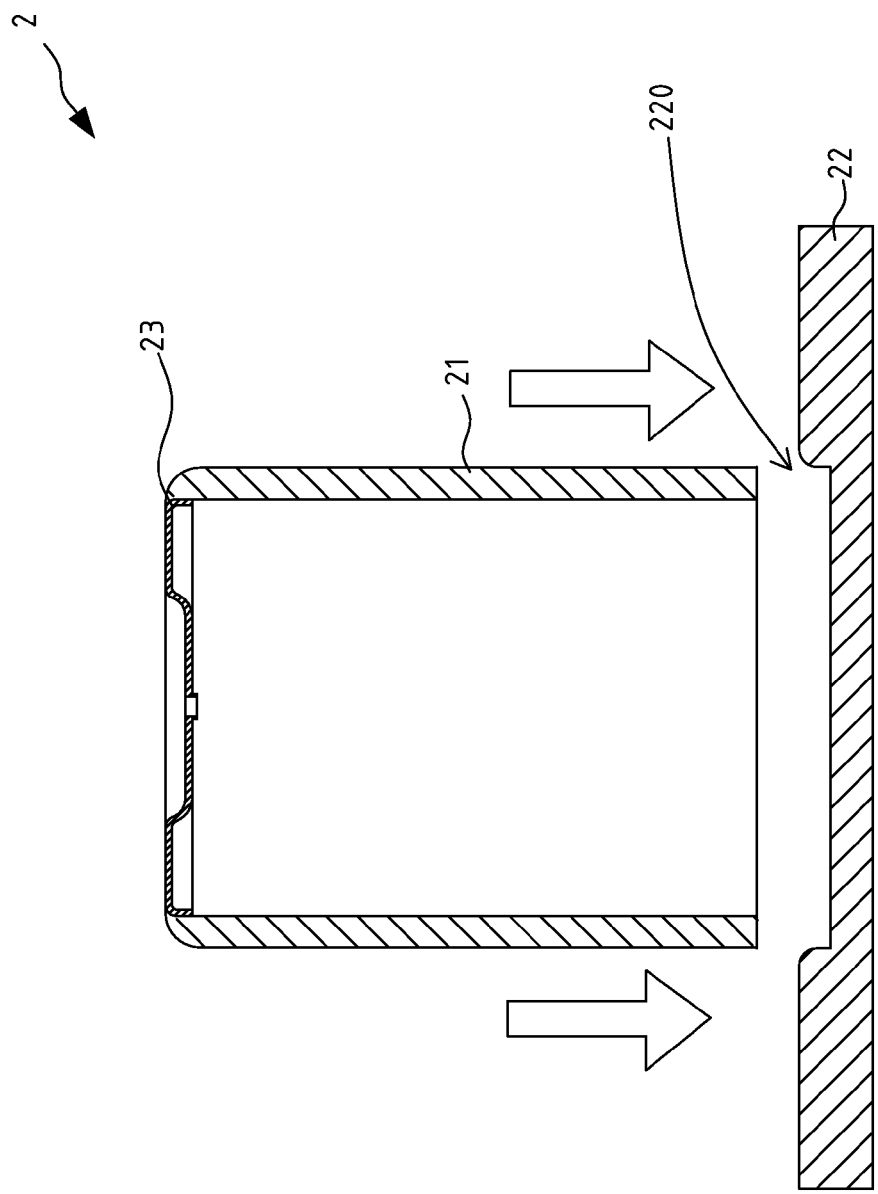
FIG. 8a is a perspective view of before mounting the lower end of the pipe above the upper surface of the base.
Figure 8B:
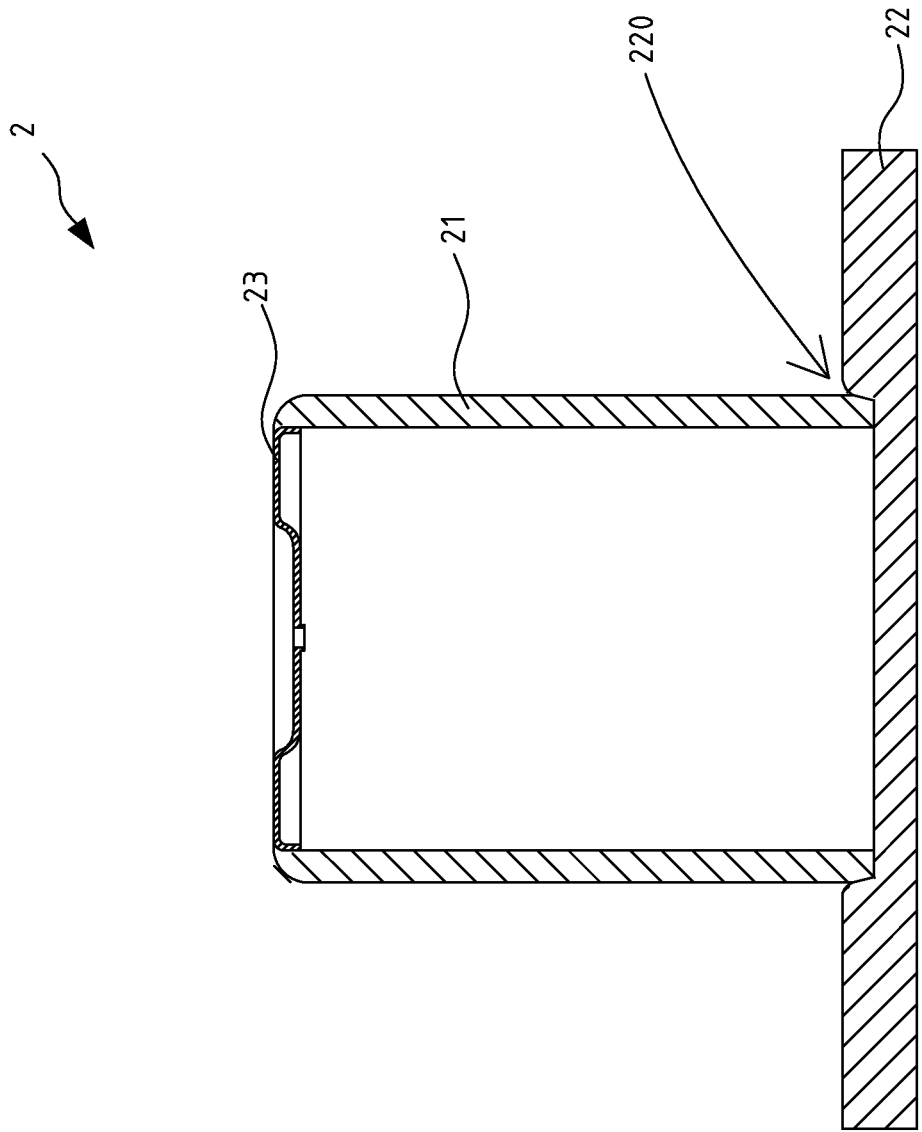
FIG. 8b is a perspective view of after mounting the lower end of the pipe on the upper surface of the base.
Figure 9A:
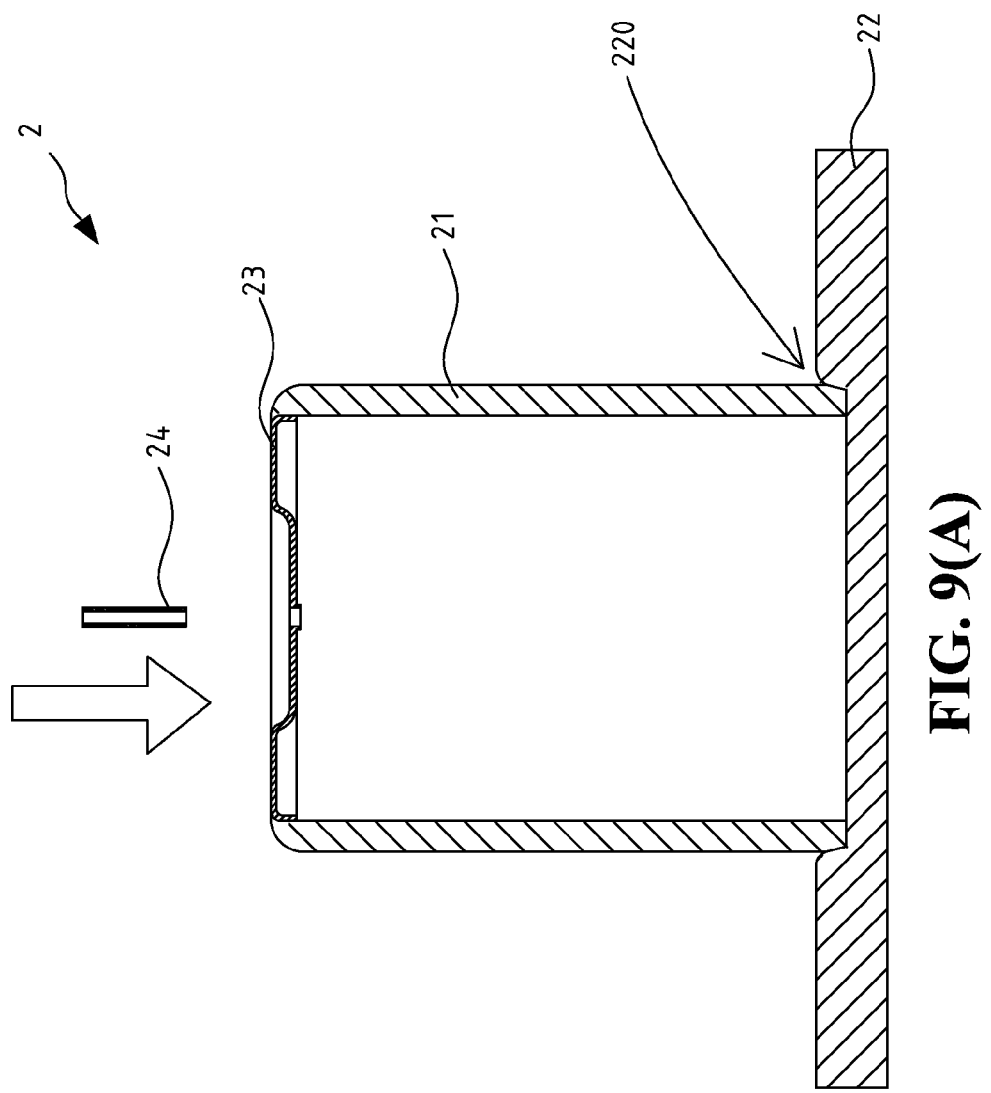
FIG. 9a is a perspective view of before mounting the small pipe in the central through-hole.
Figure 9B:
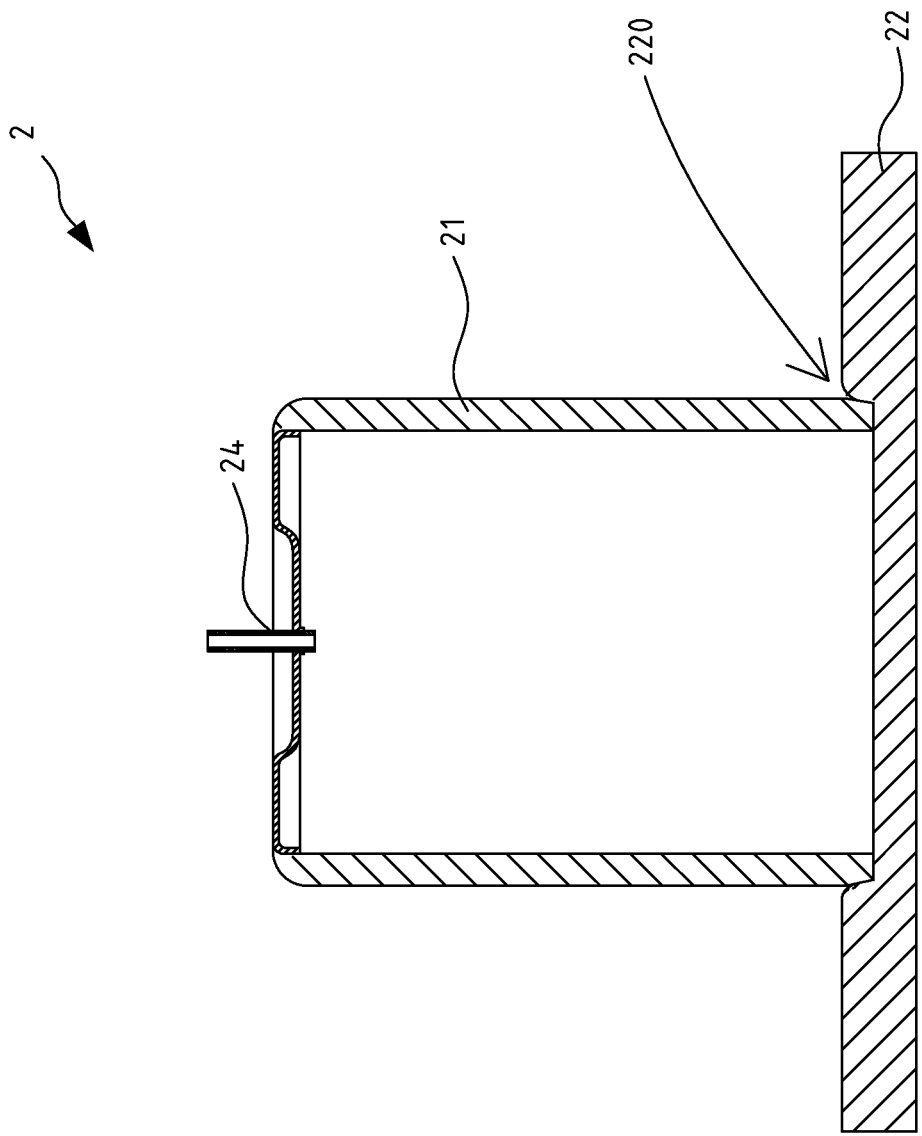
FIG. 9b is a perspective view of after mounting the small pipe in the central through-hole.

With further reference to FIG. 2, the method for brazing components of a heat pipe (2) having a pipe (21), a base (22), a cover (23), a small pipe (24) and multiple copper-silver alloy filler rings (25A, 25B, 26), wherein the pipe (21), the base (22), the cover (23) and the small pipe (24) are made of copper and brazed by the multiple copper-silver alloy filler rings (25A, 25B, 26) without flux and the pipe (21) has a diameter in range from 20 millimeters to 100 millimeters, the method comprises steps of (A) providing multiple heat pipe (2) components, (B) assembling the heat pipe (2) components to form heat pipe assemblies components, (C) injecting mixed gas, (D) turning on the multi-stage brazing heater and cooler, (E) placing the heat pipe assemblies (2') on the conveyor (12), (F) brazing the heat pipe assemblies (2') to form heat pipes to form heat pipes, (G) cooling the heat pipes (2) and (H) removing the heat pipes (2) from the conveyor (12). The heat pipe (2) is applied in an electronic equipment. The heat pipe is reduced in 400° C. for removing the oxide, is added pure water and achieves medium vacuum.

The step of (A) providing multiple heat pipe components comprises obtaining heat pipe (2) components comprising pipes (21), bases (22), covers (23), small pipes (24) and copper-silver alloy filler rings (25A, 25B, 26). The pipes (21) are hollow, and each pipe (21) has an inner diameter, an outer diameter, a lower end and an upper end. Each base (22) has a hole (220) that is larger than the outer diameter of the pipe (21). Each cover (23) includes a central through-hole (231) and is smaller than the inner diameter of the pipe (21). The small pipes (24) correspond respectively to the central through-holes (231).

The step of (B) assembling the heat pipe components to form heat pipe assemblies (2') comprises steps of (B1) assembling primary components of the heat pipe (2) and (B2) putting copper-silver alloy filler rings (25A, 25B, 26) respectively at joints between primary components.

The step of (B1) assembling primary components of the heat pipe (2) comprises mounting the cover (23) on the upper end of the pipe (21), mounting the lower end of the pipe (21) on the hole (220) of the base (22) and mounting the small pipe (24) in the central through-hole (231). After the step of (B1), the pipe (21) is fixed on the upper surface of the base (22) and the cover (23) is fixed on the upper end of the pipe (21). However, gaps will exist between primary components after this assembly step.

The step of (B2) putting the copper-silver alloy filler rings (25A, 25B, 26) respectively at joints between the primary components will cause the copper-silver alloy filler rings (25A, 25B, 26) to fill and close gaps between primary components when brazed and melted.

The step of (C) injecting mixed gas comprises injecting N2, NH4 and H2 in a ratio of 2:1:1 into the steel liner (112) of the brazing furnace (11) at the heating elements (114).

The step of (D) turning on the multi-stage brazing heater and cooler causes the initial stage to heat to approximately 220° C. and burn the mixed gas to evacuate most oxygen in the brazing furnace (11) and remove any impurities from inside the steel liner (112) to obviate oxidation of the heat pipe assemblies (2') in the brazing furnace (11).

The step of (E) placing the heat pipe assemblies (2') on the conveyor (12) comprises placing the heat pipe assemblies (2') on the conveyor (12) sliding on the input bracket assembly (121) to be carried into and through the brazing furnace (11).

The step of (F) brazing the heat pipe assemblies (2') to form heat pipes (2) comprises moving the heat pipe assemblies (2') through the multi-stage heating elements (114), heating the heat pipe assemblies (2') to 780° C. and melting the copper-silver alloy filler rings (25A, 25B, 26) to fill any gaps. In the step of (F), the copper-silver alloy filler rings (25A, 25B, 26) will be overheated and melted too early to fill any gaps effectively if the heating temperature is higher than 780° C. The copper-silver alloy filler rings (25A, 25B, 26) will not be melted completely and can not fill gaps fully if the heating temperature is lower than 780° C. In those two situations, the heat pipe assemblies (2') are not brazed excellently, air-tightness of the heat pipes (2) is destroyed and heat transfer capability of the heat pipes (2) is decreased.

The step of (G) cooling the heat pipe (2) comprises moving the brazed heat pipes (2) through the cooling element (15) and onto the output bracket assembly (122) after the heat pipes (2) are cooled to approximately 150° C.

The step of (H) removing the heat pipe (2) from the conveyor (12) comprises removing the heat pipes (2) from the output bracket assembly (122) after the molten copper-silver alloy filler rings (25A, 25B, 26) solidify may be performed robotically.

The heat pipes (2) manufactured by the device and method in accordance with the present invention can pass a reduction procedure at 400° C., a thermal shock testing between −80° C. and 150° C. and a high temperature testing at 300° C. for 72 hours to have good reliability, can maintain its heat conductivity during normal operation, can brazing the heat pipe assemblies to form heat pipes through only one step and can be used in a field of IC design, LED module and thermal energy recycling. The field of thermal energy recycling includes waste heat, hot water, solar energy industry and so like.

What is claimed is:

1. A method for brazing heat pipe components having a pipe, a base, a cover, a small pipe and multiple copper-silver alloy filler rings, the method comprising steps of:

(A) providing multiple heat pipe components comprising obtaining heat pipe components comprising pipes being hollow, and each pipe having an inner diameter, an outer diameter, a lower end and an upper end, bases, each base has a hole that is larger than the outer diameter of the pipe and has an upper surface, covers, each cover including a central through-hole and being smaller than the inner diameter of the pipe, small pipes corresponding respectively to the central through-holes and copper-silver alloy filler rings;

(B) assembling the heat pipe components to form heat pipe assemblies comprising steps of:

(B1) assembling primary components of the heat pipe comprising mounting the cover on the upper end of the pipe, mounting the lower end of the pipe on the hole of the base and mounting the small pipe in the central through-hole; and (B2) putting copper-silver alloy filler rings respectively at joints between primary components that cause the copper-silver alloy filler rings to fill and close gaps between primary components when brazed and melted;

(C) injecting mixed gas comprising injecting N2, NH4 and H2 in a ratio of 2:1:1 into a steel liner of a brazing furnace at the heating elements;

(D) turning on a multi-stage brazing heater and cooler causing an initial stage to heat to approximately 220° C. and burn the mixed gas to evacuate most oxygen in the brazing furnace and remove any impurities from inside the steel liner to obviate oxidation of the heat pipe assemblies in the brazing furnace;

(E) placing the heat pipe assemblies on a conveyor comprising placing the heat pipe assemblies on the conveyor sliding on an input bracket assembly to be carried into and through the brazing furnace;

(F) brazing the heat pipe assemblies to form heat pipes comprising moving the heat pipe assemblies through the multi-stage heating elements, heating the heat pipe assemblies to 780° C. and melting the copper-silver alloy filler rings to fill any gaps;

(G) cooling the heat pipes comprising moving the brazed heat pipes through the cooling element and onto an output bracket assembly after the heat pipes are cooled to approximately 150° C.; and (H) removing the heat pipes from the conveyor comprising removing the heat pipes from the output bracket assembly after the molten copper-silver alloy filler rings solidify, wherein the pipe, the base, the cover and the small pipe are made of copper and brazed by the multiple copper-silver alloy filler rings without flux and the pipe has a diameter in range from 20 millimeters to 100 millimeters, the heat pipe is reduced in 400° C. for removing oxide.

* * * * *